United States Patent
Yeo et al.

(10) Patent No.: US 6,906,398 B2
(45) Date of Patent: Jun. 14, 2005

(54) SEMICONDUCTOR CHIP WITH GATE DIELECTRICS FOR HIGH-PERFORMANCE AND LOW-LEAKAGE APPLICATIONS

(75) Inventors: Yee-Chia Yeo, Singapore (SG); Fu-Liang Yang, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/335,962

(22) Filed: Jan. 2, 2003

(65) Prior Publication Data

US 2004/0129995 A1 Jul. 8, 2004

(51) Int. Cl.$^7$ .............................................. H01L 29/72
(52) U.S. Cl. ..................... 257/500; 257/297; 257/300; 257/310; 257/316
(58) Field of Search ............................. 257/297, 300, 257/310, 316, 500

(56) References Cited

U.S. PATENT DOCUMENTS

| | | |
|---|---|---|
| 5,321,289 A | 6/1994 | Baba et al. |
| 5,668,035 A | 9/1997 | Fang et al. |
| 6,013,553 A | 1/2000 | Wallace et al. |
| 6,015,739 A | 1/2000 | Gardner et al. |
| 6,030,862 A | 2/2000 | Kepler |
| 6,168,958 B1 | 1/2001 | Gardner et al. |
| 6,265,325 B1 | 7/2001 | Cao et al. |
| 6,303,418 B1 | 10/2001 | Cha et al. |
| 6,383,861 B1 | 5/2002 | Gonzalez et al. |
| 6,448,127 B1 | 9/2002 | Xiang et al. |
| 6,479,341 B1 | 11/2002 | Lu |
| 6,495,422 B1 | 12/2002 | Yu et al. |
| 6,528,858 B1 | 3/2003 | Yu et al. |
| 6,621,114 B1 * | 9/2003 | Kim et al. .................. 257/310 |
| 6,632,714 B2 | 10/2003 | Yoshikawa |
| 6,640,403 B2 | 11/2003 | Shih et al. |

FOREIGN PATENT DOCUMENTS

TW  426941  3/2001

OTHER PUBLICATIONS

Yeo, et al., "Direct Tunneling Leakage Current and Scalability of Alternative Gate Dielectrics", Applied Physics Letters, vol. 81, No. 11, Sep. 9, 2002, pp. 2091–2093.
Chen, et al., "Downscaling Limit of Equivalent Oxide Thickness in Formation of Ultrathin Gate Dielectric by Thermal–Enhanced Remote Plasma Nitridation", IEEE Transactions on Electron Devces, vol. 49, No. 5, May 2002, pp. 840–846.
"Bake and Cure of Low–k Dielectric Layers," Koyo Thermo Systems Co., Ltd., http://www.crystec.com/klllowe.htm.
Mahapatra, R., et al., "ZrO$_2$as a High–k Dielectric for Strained SiGe MOS Devices," Bull. Mater. Sci., vol. 25, No. 6, Nov. 2002, pp. 455–457.

* cited by examiner

*Primary Examiner*—Edward Wojciechowicz
(74) *Attorney, Agent, or Firm*—Slater & Matsil, L.L.P.

(57) ABSTRACT

Both high performance and low leakage current devices can be formed on a single wafer without significant additional processing steps by the formation of an ultra-thin gate dielectric and a high-permittivity gate dielectric, respectively, in regions wherein switching speed and low leakage current, respectively, are desired. Logic and embedded memory regions can be performance optimized on the same integrated circuit.

17 Claims, 5 Drawing Sheets

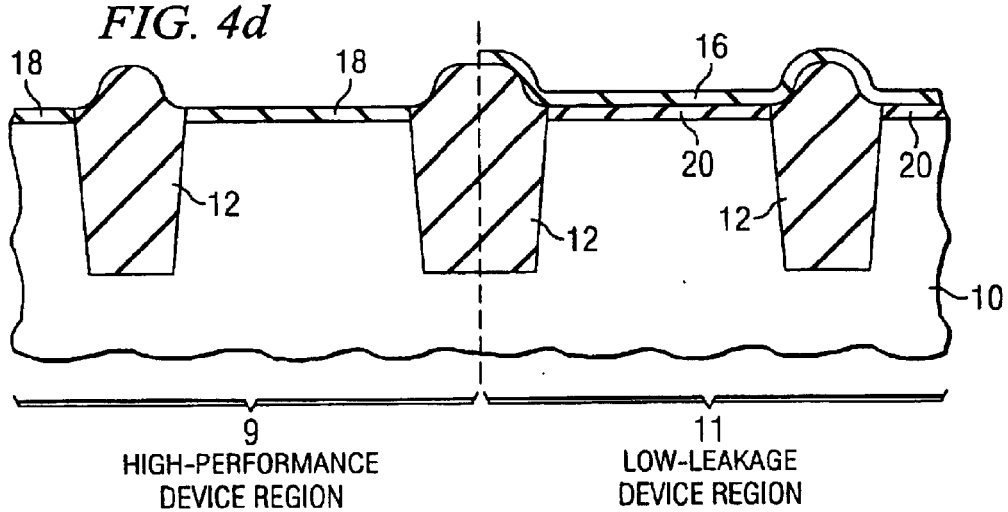
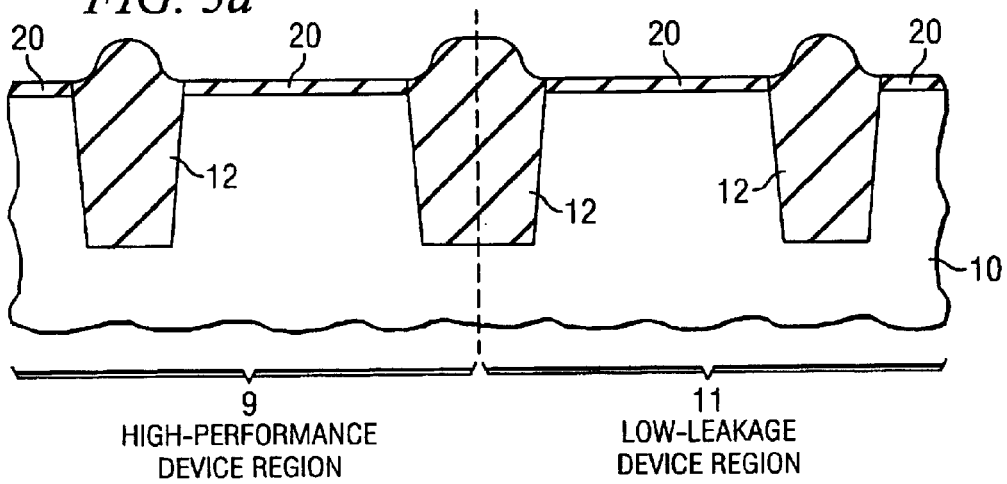
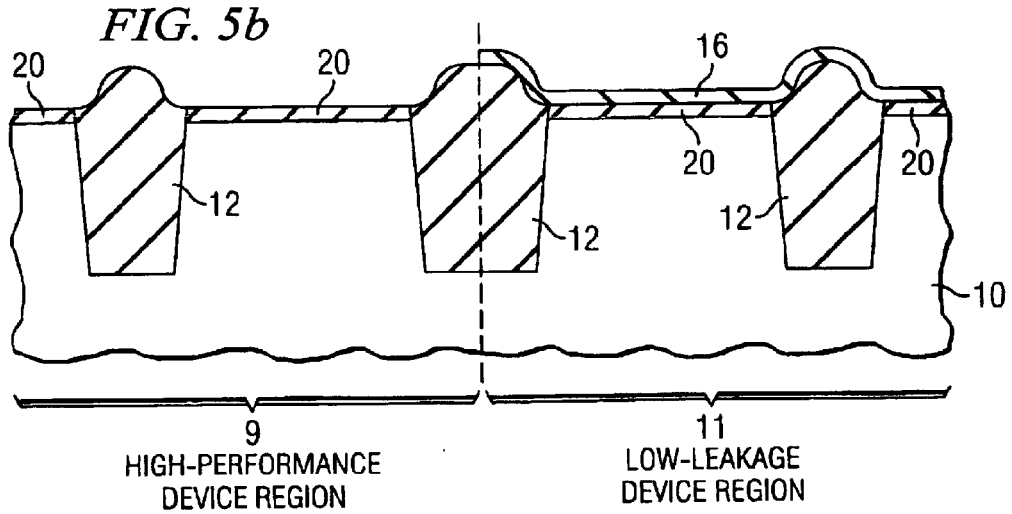

9 HIGH-PERFORMANCE DEVICE REGION

11 LOW-LEAKAGE DEVICE REGION

9 HIGH-PERFORMANCE DEVICE REGION

11 LOW-LEAKAGE DEVICE REGION

SEMICONDUCTOR CHIP WITH GATE DIELECTRICS FOR HIGH-PERFORMANCE AND LOW-LEAKAGE APPLICATIONS

TECHNICAL FIELD

The present invention relates generally to the field of semiconductor devices and more particularly to semiconductor chips having differing gate dielectrics in different regions of the chips and the methods for the manufacturing of same.

BACKGROUND

Size reduction of the metal-oxide-semiconductor field-effect transistor (MOSFET) has enabled the continued improvement in speed performance, density, and cost per unit function of integrated circuits over the past few decades. As the gate length of the conventional bulk MOSFET is reduced, it suffers from problems related to the inability of the gate to substantially control the on and off states of the channel. Phenomena such as reduced gate control associated with transistors with short channel lengths are termed short-channel effects. These short channel effects become particularly pronounced as device geometries shrink to 0.13 microns and below. One of the primary means by which short-channel effects are kept under control is the downscaling of the gate dielectric thickness in conjunction with transistor size reduction.

The scaling trend of the MOSFET gate dielectric thickness is shown in FIG. 1. The projected range of the equivalent silicon oxide ($SiO_2$) thickness $t_{ox,eq}$ for high-performance logic applications is plotted using bars (plotted against the left axis). For example, in the year 2016, $t_{ox,eq}$ is expected to be less than 6 angstroms for high performance logic applications. The supply voltage VDD is also indicated in FIG. 1. Assuming the most conservative $t_{ox,eq}$ scaling, i.e. largest value for each bar, the gate leakage current density through $SiO_2$ is calculated and plotted as the solid line 2 (plotted against the right axis). Even with conservative $t_{ox,eq}$ scaling, excessive gate leakage prohibits continued gate dielectric scaling using $SiO_2$. Under current process technologies, ultra-thin films are in the range of 2 angstroms to 20 angstroms. Preferably, ultra-thin $SiO_2$ films are less than 10 angstroms. Such ultra-thin not only lead to excessive leakage, but also aggravate the problems of poly-silicon (poly-Si) gate depletion, gate dielectric integrity, and gate dopant penetration to the channel region.

So-called high-k gate dielectrics have been proposed because of their improved gate leakage properties. High-k gate dielectrics, examples of which include metallic oxides such as aluminum oxide $Al_2O_3$, zirconium oxide $ZrO_2$, and hafnium oxide $HfO_2$, silicates such as $ZrSiO_4$, and aluminates such as lanthanum aluminate may be suitable candidates. Most high-k gate dielectrics in direct contact with the silicon substrate have poorer interface properties compared to $SiO_2$ or SiON on silicon. Therefore, an interfacial $SiO_2$ or SiON layer is typically inserted below the high-k gate dielectric to obtain reasonable carrier mobilities in the transistor channel.

U.S. Pat. No. 6,015,739 describes a method for the fabrication of a gate dielectric stack where a dielectric film with a relative dielectric permittivity or relative permittivity of 20–200 overlies a silicon nitride film over a native oxide layer formed on a semiconductor substrate. U.S. Pat. No. 6,448,127, describes a method for the formation of a high-k gate dielectric overlying silicon oxide. The relative permittivity of a material is the ratio of the electric permittivity of the material to the permittivity of free space $\epsilon_0$. The permittivity of free space is $8.85 \times 10^{-12}$ F/m.

The gate dielectric stack structures such as those described above have limited scalability to ultra-thin equivalent SiO2 thicknesses below approximately 7 angstroms for high performance applications. Although transistors with high-k/$SiO_2$ or high-k/SiON stack gate dielectrics provide improved gate leakage current performance, they do so at the sacrifice of switching speed. As such, the high-k devices are not a satisfactory solution in applications where speed performance is important.

Other attempts at improving device performance have involved the provision of transistors on the same chip with differing gate oxides. Examples include U.S. Pat. No. 5,668,035 issued to Fang et al., U.S. Pat. No. 6,030,862 issued to Kepler, U.S. Pat. No. 6,265,325 issued to Cao et al., U.S. Pat. No. 6,383,861 issued to Gonzalez et al., and U.S. Pat. No. 6,168,958 issued to Gardner et al.

Various shortcomings in the prior art can be overcome and advantageous features obtained by the provision of a semiconductor chip having high-k gate dielectrics on those regions of the chip where gate leakage current is more important and having ultra-thin gate dielectrics where switching speed is more important.

SUMMARY OF THE INVENTION

In one aspect, the present invention provides for an integrated circuit comprising a substrate, a first transistor having an ultra-thin gate dielectric formed on the substrate, and a second transistor having a gate dielectric comprised of a high-permittivity dielectric material formed on the substrate.

In another aspect, the present invention provides for a method of fabricating an integrated circuit. The method includes the steps of forming an isolation structure on a substrate, forming a high-permittivity dielectric material on the substrate, and removing the high-permittivity dielectric material from a first region of the substrate while leaving the high-permittivity dielectric material over a second region of the substrate. The method further includes forming an ultra-thin gate dielectric material over the first region.

In yet another aspect, the present invention provides for an integrated circuit formed on a substrate. The integrated circuit includes a first region formed on the substrate. The first region has formed therein a plurality of first transistors, each of said plurality of first transistors including a first source region, a first drain region, a first channel region formed between the first source and first drain region, and a first gate conductor electrically separated from the first channel region by a high permittivity dielectric material. The integrated circuit also includes a second region formed on the substrate. The second region has formed therein a plurality of second transistors, each of the plurality of second transistors including a second source region, a second drain region, a second channel region formed between the second source and second drain regions, and a second gate conductor electrically isolated from the second channel region by an ultra-thin dielectric material.

An advantageous feature of the present invention is that transistors having desired high switching speed can be fabricated on the same substrate as transistors having desirable low gate leakage current characteristics. This feature is particularly advantageous for, e.g., embedded memory arrays.

Another advantageous feature of the present invention is that it is well-suited for geometries of 0.13 microns, 90 nanometers, and even below wherein short channel effects are particularly pronounced. In addition to scalability, the present invention provides the advantageous feature of being adaptable to double-gate structures, fin-FET structures, and other small geometry transistor structures.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4(a) through 4(d) illustrate an alternate preferred embodiment method for the manufacture of an integrated circuit having both high performance transistors and low leakage current transistors on the same chip;

FIGS. 5(a) through 5(c) illustrate yet another alternate embodiment method for the manufacture of an integrated circuit having both high performance transistors and low leakage current transistors on the same chip;

DETAILED DESCRIPTION OF ILLUSTRATIVE EMBODIMENTS

Figure 1:
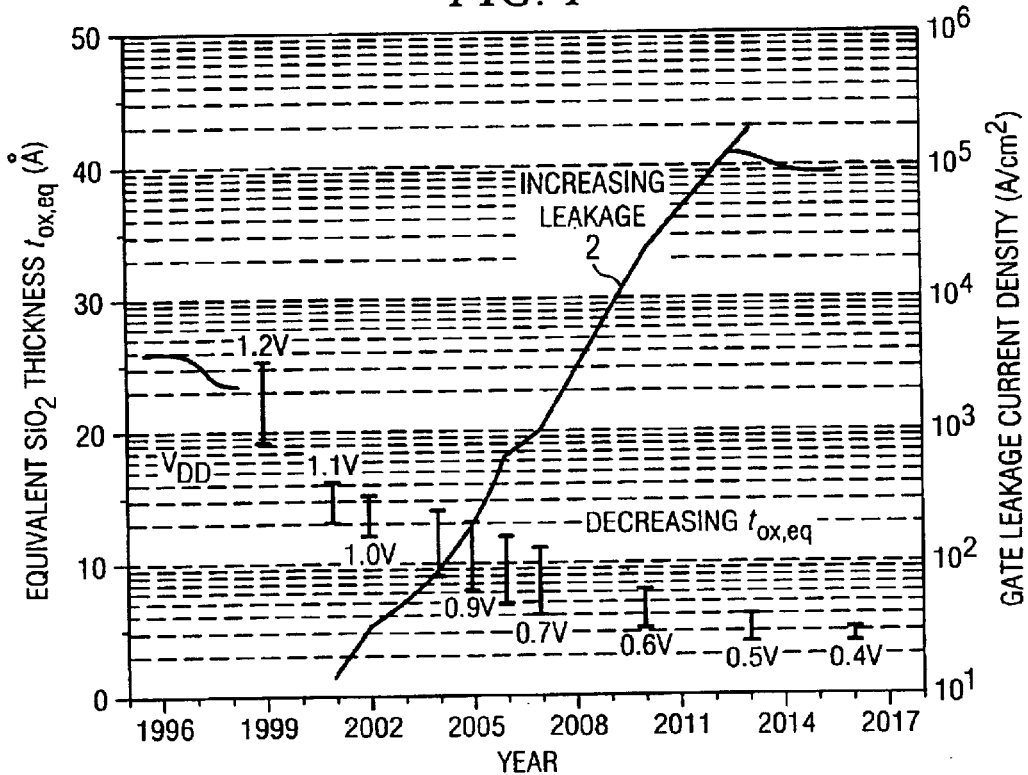
FIG. 1 is a chart showing the relationships between gate equivalent $SiO_2$ thickness, gate leakage current, and supply voltage.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. For ease of reference, common reference numerals will be used throughout the figures when referring to the same or similar features common to the figures.

In the preferred embodiments of the present invention, at least two different gate dielectric materials are formed on a semiconductor chip to obtain both high-performance devices and low-leakage devices on the same chip. Preferably, a silicon oxide $SiO_2$ or silicon oxynitride SiON gate dielectric is provided for high-performance devices, and another gate dielectric comprising a stacked high-k/$SiO_2$ or high-k/SiON gate dielectric is provided for low-leakage devices.

In the preferred embodiments, "high-performance" refers generally to devices having gate delays on the order of picoseconds. In order to achieve such short gate delays, high performance devices typically employ ultra-thin gate dielectrics with high gate leakage current of 1 A/cm$^2$ or higher. "Low-leakage" devices refers generally to devices having leakage current that is approximately 3 orders of magnitude lower than that of high-performance devices. One skilled in the art will recognize that gate delays and leakage currents are functions of multiple variables, including device design, minimum feature size, materials and the like. The present invention is applicable to a broad range of feature sizes and device designs. As feature sizes continue to shrink, gate delay and leakage current performance parameters will change significantly. As such the terms "high-performance" and "low leakage" should not be considered as absolute parameters or characteristics, but should be construed as being relativistic terms with a high-performance device switching at appreciably faster speeds or shorter gate delays than a low leakage device (for the given application) and a low leakage device showing appreciably improved leakage current performance relative a high-performance device (again relative to the technology in which the invention is embodied).

The preferred embodiment of the present invention includes a semiconductor chip that may be provided with an ultra-thin gate dielectric comprising $SiO_2$, silicon oxynitride SiON, silicon nitride for high-performance devices, and another gate dielectric comprising a high permittivity (high-k) dielectric for low-leakage devices. In the currently preferred embodiments, high-k dielectrics are dielectrics with relative permittivities of 8 or larger. The gate dielectric comprising a high-k dielectric may be a stacked dielectric consisting of a high-k dielectric overlying an interfacial layer. Examples of high-k dielectrics include metallic oxides such as hafnium oxide $HfO_2$, zirconium oxide $ZrO_2$, aluminum oxide $Al_2O_3$, lanthanum oxide $La_2O_3$, titanium oxide TiO2, yttrium oxide $Y_2O_3$, and tantalum oxide $Ta_2O_5$, oxynitride of a metal, such as zirconium oxynitride ZrOxNy and hafnium oxynitride HfOxNy, metallic silicates such as zirconium silicate ZrSiO4, and metallic aluminates, such as zirconium aluminate. Other high-k dielectrics will be apparent to one of ordinary skill in the art and can be evaluated using routine experimentation. In general, any dielectric with a permittivity greater than 8 may be considered a high-k dielectric. Examples of the interfacial layer include $SiO_2$, SiON, metallic silicates such as zirconium silicate, and metallic aluminates such as zirconium aluminate.

Figure 2:
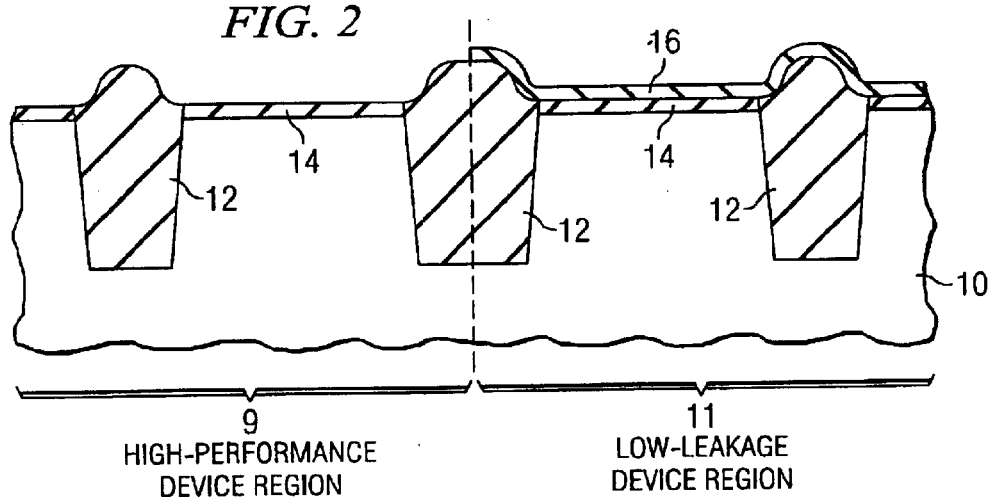
FIG. 2 illustrates in cross-section a substrate having an isolation structure separating a high performance region from a low leakage current region of a device.

A schematic of the high performance device region and low-leakage device region in the semiconductor chip is shown in FIG. 2. While a bulk semiconductor substrate 10 is illustrated in FIG. 2, this invention is not restricted to bulk semiconductor substrates, and generally applies to any substrate, e.g. silicon-on-insulator (SOI) substrates. In the preferred embodiment, as shown in FIG. 2, the isolation structure 12 is shallow trench isolation. It is understood that isolation may also be accomplished by other means of isolation such as any of a number of variations of local oxidation of silicon (LOCOS), such as recessed, semi-recessed LOCOS, through the formation of silicon "islands" on an insulating substrate, and the like.

For purposes of explanation, substrate 10 is illustrated as being divided into two adjacent regions. High-performance devices will be formed in region 9 using, e.g., $SiO_2$, SiON or similar conventional gate dielectric material. Low leakage current devices will be fabricated in region 11 using a high-k gate dielectric. Regions 9 and 11 are illustrated as being separated by isolation structure 12. One skilled in the art will recognize that FIG. 2 is for illustration only and that the size, placement, and arrangement of region 9 and 11 will vary considerably in actual implementations. Additionally, multiple high-performance regions 9 and low leakage current regions 11 may be formed on a single chip. As an example, low leakage current 11 could have formed therein a memory array, wherein leakage current is a primary design parameter. High-performance region 9 could have formed therein support logic for the memory array wherein switching speed is a more important consideration.

Figure 3A:
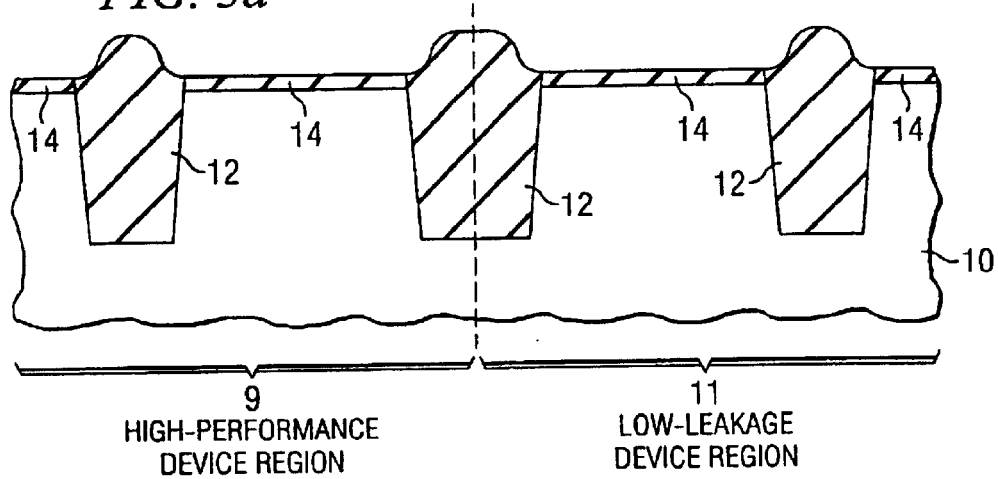
FIGS. 3(a) through 3(c) illustrate steps in a preferred embodiment method for the manufacture of an integrated circuit having both high performance transistors and low leakage current transistors on the same chip.
Figure 4A:
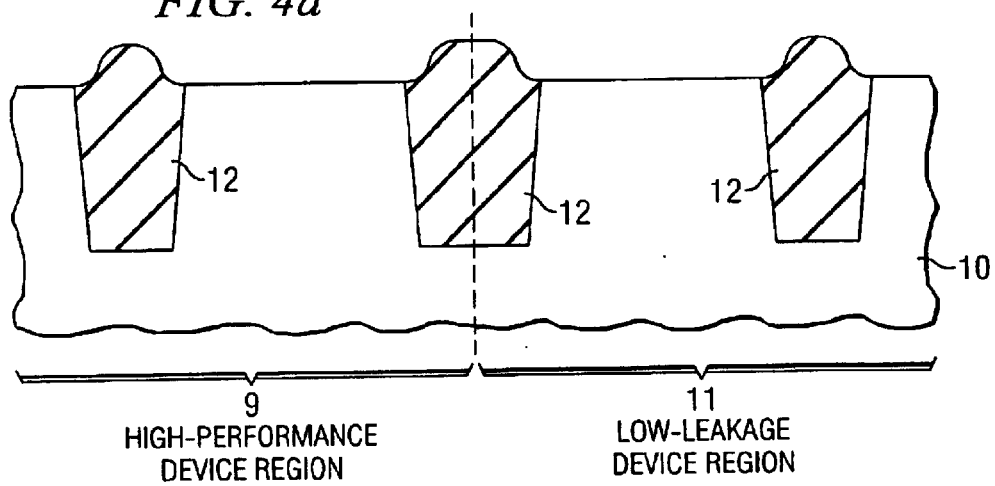

Methods for the fabrication of gate dielectrics for high-performance and low-leakage applications on the same semiconductor chip are described below. A semiconductor substrate 10 is provided with device isolation 12 such as shallow trench isolation. The substrate 10, preferably a silicon wafer, may then be cleaned before performing the deposition of the high-permittivity dielectric. Substrate 10 is preferably cleaned such that only a thin native oxide layer 14 remains on the substrate 10 surface, as shown in FIG. 3(a). The thickness of this native oxide layer 14 is typically several angstroms thick, and usually below 5 angstroms. In alternative embodiment, native oxide layer 14 is removed prior to the high-k dielectric deposition, by methods known and used in the art, such as hydrogen baking at elevated temperatures, e.g. greater than 700 degrees Celsius. FIG. 4(a) illustrates the cross-section of the wafer 10 after the native oxide layer 14 removal.

Figure 3B:
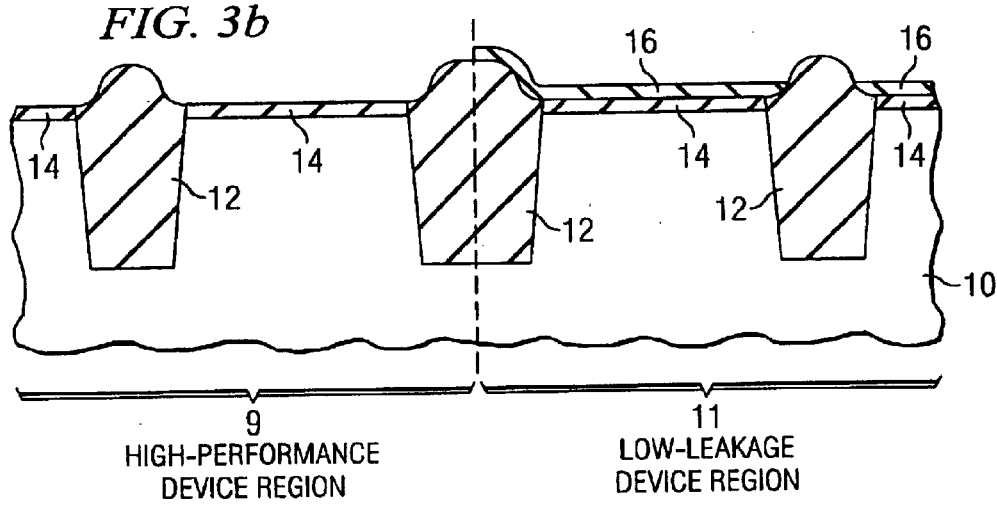
Figure 4B:
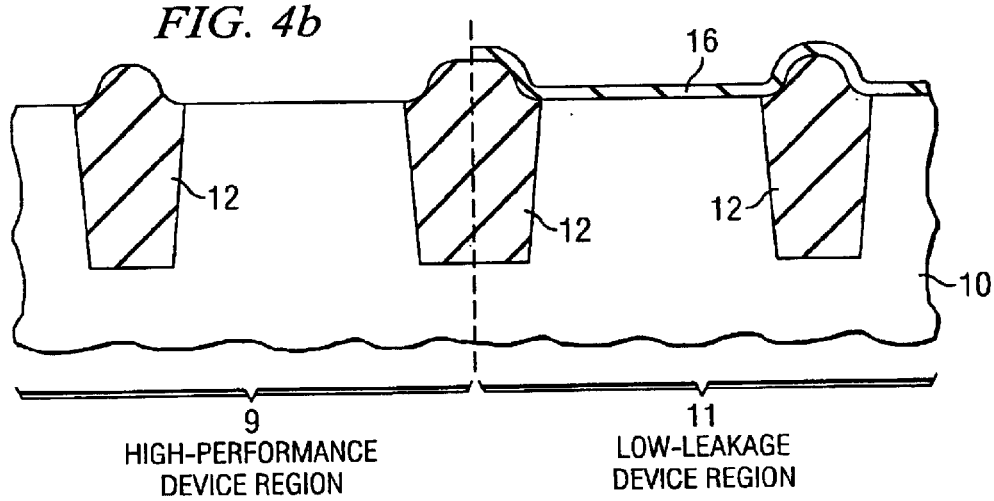

A high-k gate dielectric is then deposited on the native oxide layer 14, preferably by chemical vapor deposition (CVD) process. For example, hafnium oxide HfO2 may be grown by CVD using precursor gases such as hafnium t-butoxide $Hf(OC_4H_9)_4$ and oxygen $O_2$. The growth temperature may be between 350 to 500 degrees Celsius, and the pressure can be about $1 \times 10^{-5}$ Torr. A post-deposition anneal in nitrogen $N_2$ ambient at temperatures of up to 950 degrees Celsius and time of up to 30 seconds may be performed to improved the gate dielectric quality. Other methods of deposition may also be used, such as sputtering, reactive sputtering, atomic layer deposition, etc. After the high-k gate dielectric deposition, a lithography step is performed to mask the low-leakage device region 11 using conventional photolithographic techniques. The high-k dielectric in the high-performance device region 9, which is left exposed during the photolithographic step is removed by techniques such as wet etching or dry etching. For example, the etching of $HfO_2$ may be accomplished by wet etch using sulphuric acid $H_2SO_4$. The resulting cross-section of the wafer is as shown in FIG. 3(b), wherein high-k dielectric material 16 remains overlying native oxide layer 14 in the low leakage region 11 and has been removed in the high-performance region 9, thus leaving native oxide layer 14 exposed in that region. FIG. 4(b) illustrates patterned high-k layer 16 for the alternative embodiment in which native oxide layer 14 has been removed prior to the high-k gate dielectric deposition.

Figure 3C:
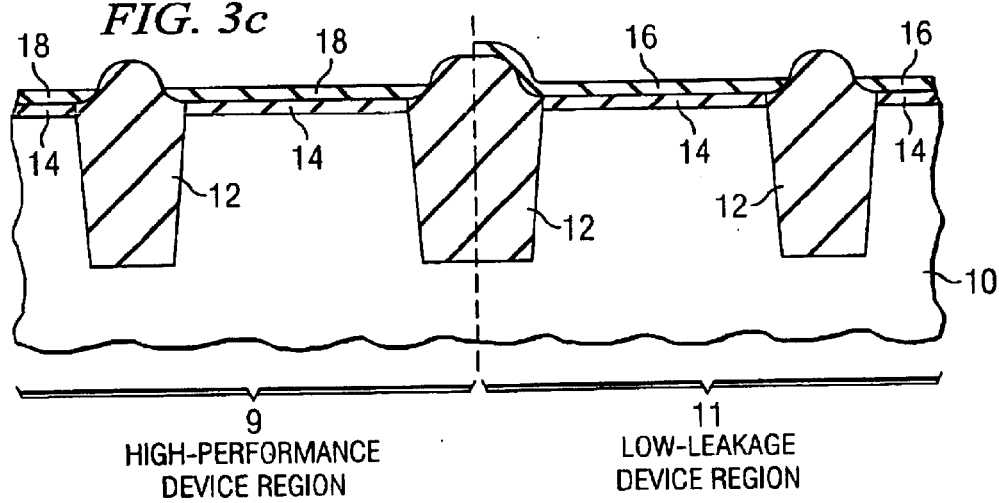

The next process step involves the treatment of the wafer in an oxidizing ambient at elevated temperatures. The oxidizing ambient may contain species such as water vapor $H_2O$, oxygen $O_2$, ozone $O_3$, or nitrous oxide $N_2O$. The oxidation step results in the formation of a silicon oxide layer 18. An example of the oxidation step is in-situ steam growth (ISSG) of $SiO_2$ by using a single-wafer rapid-thermal based process at 850 degrees C. at a pressure of 6 Torr. Another example of the oxidation step is furnace oxide growth in an $O_2$ ambient at atmospheric pressure for a time of between 1 to 30 minutes and a temperature ranging from 600–800 degrees Celsius. The silicon oxide 18 formed in the high-performance device region may have a thickness in the range of 2 to 30 angstroms. This oxidation layer is illustrated in FIG. 3(c). Note that the oxide grows only over the exposed native oxide layer 14 in high performance region 9, and not on the high-k dielectric layer 16 in low leakage region 11. Hence, there is no need to mask low leakage region 11 during the oxidation step or to subsequently remove oxide layer 18 from the low leakage region.

In some embodiments, the oxidation step may be followed by a nitridation step, using a process such as remote plasma nitridation (RPN). In the RPN process, the silicon oxide is exposed to a high-density remote helicon-based nitrogen discharge to perform the nitridation treatment. Nitrogen radicals in the plasma react with portions of the silicon oxide to form a nitrogen-containing gate dielectric. The equivalent silicon oxide thickness of the ultra-thin gate dielectric in the high-performance device region is less than 10 angstroms.

Figure 4C:
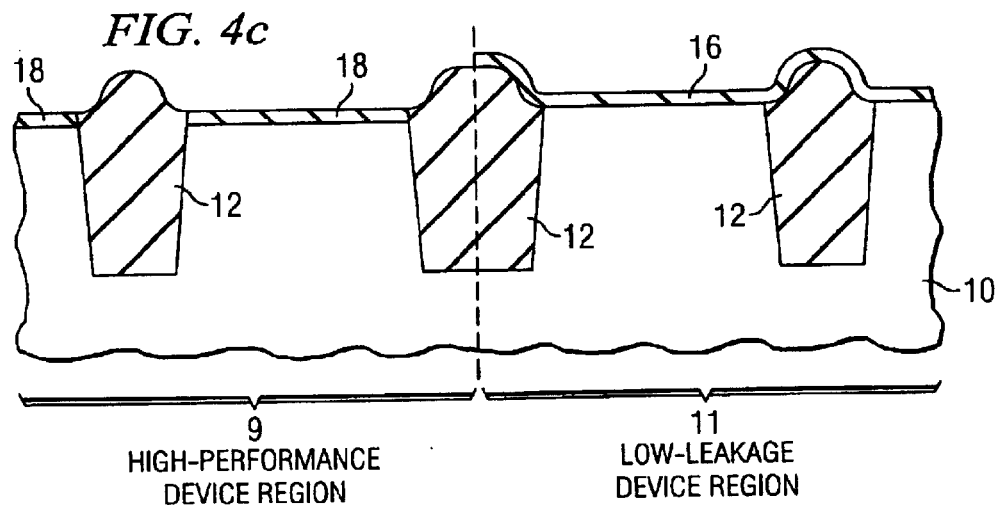

The oxidation and/or nitridation process steps result in the formation of the ultra-thin gate dielectric in the high-performance device region, as shown in FIG. 3(c) and 4(c) for the cases where native oxide layer 14 remains or is removed, respectively. This ultra-thin gate dielectric 18 may comprise silicon oxide or silicon oxynitride. The equivalent silicon oxide thickness $t_{ox,eq}$ of this ultra-thin gate dielectric is preferably less than 7 angstroms.

Note in FIG. 4(c), the high-k dielectric layer 16 is formed directly on silicon substrate 10. As discussed above, typical high-k dielectric materials have poor characteristics at the silicon interface, which may result in undesirable device properties and performance. FIG. 4(d) illustrates a preferred embodiment in which an interfacial layer 20 is formed on the substrate 10 prior to the formation of the high-k dielectric layer 16 (also illustrated in FIG. 4(d) is silicon oxide or silicon oxynitride layer 18, which is formed after the high-k dielectric layer as described above). This interfacial layer may be silicon oxide, silicon oxynitride, a silicate such as hafnium silicate, or an oxynitride such as hafnium oxynitride. In the case where the interfacial layer is silicon oxide, it may be formed by a thermal oxidation step in an oxygen ambient at temperatures ranging from 500 to 800 degrees Celsius. The interfacial layer may also be formed by other techniques such as CVD, thermal oxidation followed by RPN, etc. In the preferred embodiment, the thickness of this interfacial layer may range from 2 angstroms to 30 angstroms.

Figure 5C:
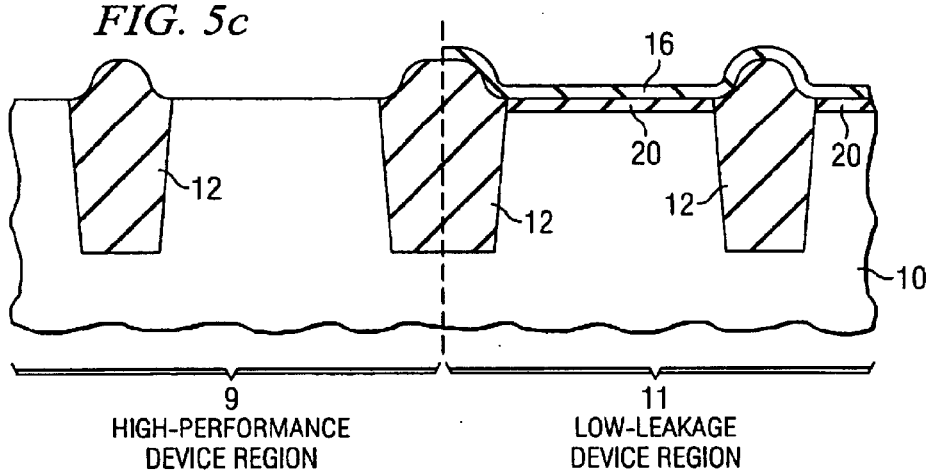

In accordance with another embodiment of this invention, a substrate 10 with isolation structures 12 is provided, and a silicon oxide or silicon oxynitride interfacial layer 20 is then formed on the device regions, as described above and as shown in FIG. 5(a). A high-k dielectric is then provided over the entire wafer. A lithography step is performed to mask the low-leakage device region 11. The high-k dielectric in the high-performance device region 9 is then removed by techniques such as wet etching or dry etching. For example, the etching of $ZrO_2$ may be accomplished by wet etch using sulphuric acid $H_2SO_4$. The etching of the high-k dielectric may stop on the underlying silicon oxide or silicon oxynitride layer 20, as illustrated in FIG. 5(b), or, in an alternative embodiment, it may partially or fully etch the underlying silicon oxide or silicon oxynitride layer 20, as shown in FIG. 5(c). Following this etch step, an optional oxidation and/or nitridation process step may be performed (not shown).

Figure 6:
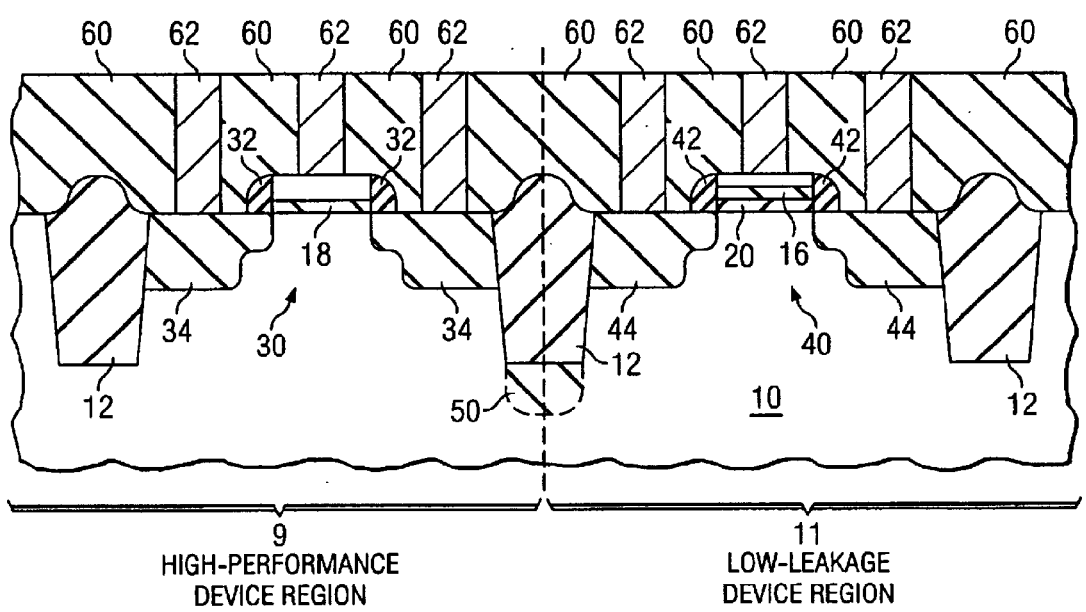
FIG. 6 illustrates select regions of an integrated circuit having both high performance transistors and low leakage current transistors and incorporating advantageous features of the present invention.

FIG. 6 illustrates an exemplary integrated circuit having both a high performance region 9, e.g., a logical circuit region, and a low leakage current region 11, e.g., a memory array region. One exemplary transistor is illustrated in each region for the sake of clarity, although one skilled in the art will recognize that each region will contain multiple transistors and other structures, and that typically, transistors in the different regions will not necessarily be adjacent one another.

Transistor 30 is isolated from transistor 40 by a shallow trench isolation (STI) region 12. The STI region 12 is formed from a trench about 2500 to about 5000 angstroms. The trench is filled with an insulator, such as silicon dioxide, as an example. A more heavily doped semiconductor region 50 can optionally be formed to provide further isolation. Alternatively, other isolation, such as field isolation, can be utilized.

The stack gate dielectric for low leakage current transistor 40 comprises a high-k dielectric layer 16 overlying interfacial layer 20. These layers are formed as described above. Silicon oxide gate dielectric 18 for high performance transistor 30 is also formed in a manner as described above. As noted above, high performance transistor 30 could have a gate dielectric formed of silicon oxynitride or other known alternatives. Gate electrode materials are deposited and then patterned using standard photolithographic and etch processes to form gate electrodes.

A lightly doped implant is then formed for each transistor region. Resist can be used to protect the region that is not being doped. Sidewall spacers 32 and 42 are then formed over both gates followed by more heavily doped implants for each transistor. These implants, preferably using arsenic and/or phosphorus for the n-channel device and boron for the p-channel device, form the source/drain regions 34 and 44 of the transistors 30 and 40, respectively. Once again, resist can be used to protect the region that is not being doped.

A dielectric layer 60 is formed over the device. This dielectric layer typically comprises an oxide such as silicon dioxide or a doped glass such as phosphosilicate glass (PSG) or borophosphosilicate glass (BPSG). Vias are formed in the dielectric layer 60 and filled with conductive material to form contacts (or plugs) 62. As an example, the conductive material could be tungsten. Although each source, drain and gate is shown as having a contact opening to it, it is understood that fewer (or more) contacts could be used and could contact whichever regions the particular design requires.

After formation of the vias or plugs, an etch stop layer (not shown) is preferably formed over dielectric layer 60, follow by another dielectric layer (not shown), which can then be patterned with vias and trenches which are subsequently filled with a conductive material such as copper using a damascene or dual damascene process. In this manner, transistors in the respective high performance and low leakage current regions can be interconnected within the regions as well as between the regions.

Figure 7:
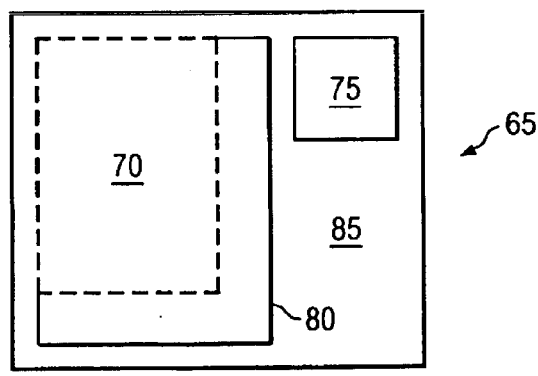
FIG. 7 illustrates in plan view an integrated circuit having different regions where transistor switching speed is more important and where low leakage current is more important, respectively.

FIG. 7 illustrates in plan view an exemplary integrated circuit 65 having a first memory array region 70, such as an array of embedded DRAM memory. The memory array 70 is comprised of low leakage current transistors, such as transistor 40 illustrated in FIG. 6. Surrounding support logic, comprised of high-performance transistors, such as transistor 30 of FIG. 6, are shown adjacent memory array 70 in region 80. A second embedded memory region 75 is also illustrated adjacent logic region 85. Embedded memory region 75, having all or primarily low leakage current transistors is preferably an embedded cache memory for a CPU or DSP circuit comprising high-performance transistors in region 85. Other combinations and arrangements of high-performance and low leakage current regions and transistors will be apparent to those of ordinary skill in the art.

Aspects of the present invention are especially useful in small sized technologies. For example, the integrated circuit that includes transistors 30 and 40 can be formed using 0.13 $\mu$m or 90 nm technology or even smaller. In these cases, the transistor channel lengths (of most if not all of the transistors) will be about 0.13 $\mu$m and 90 nm or less, respectively. It is expected that the present invention will also be useful at smaller dimensions, e.g., for a physical gate length of 45 m or less.

In the foregoing specification, the invention has been described with reference to specific embodiments. However, various modifications and changes can be made by one skilled in the art without departing from the scope of the present invention. Accordingly, the specification and figures are to be regarded in an illustrative rather than a restrictive sense, and all such modifications are intended to be included within the scope of the present invention.

What is claimed is:

1. An integrated circuit comprising:
    a substrate;
    a first transistor having a first gate dielectric with a first oxide equivalent thickness, comprising an ultra-thin gate dielectric formed on the substrate; and
    a second transistor having a second gate dielectric with a second oxide equivalent thickness, comprising a high-permittivity dielectric material formed on the substrate, wherein the second oxide equivalent thickness is different than the first oxide equivalent thickness.

2. The integrated circuit of claim 1 wherein said substrate is selected from the group consisting of silicon, germanium, and silicon-on-insulator.

3. The integrated circuit of claim 1 wherein said ultra-thin gate dielectric is selected from the group consisting of silicon oxide, silicon oxynitride, and silicon nitride.

4. The integrated circuit of claim 1 wherein said high-permittivity dielectric material is selected from the group consisting of metallic oxides, oxynitrides of metals, metallic silicates, and metallic aluminates.

5. The semiconductor chip of claim 1 wherein the relative permittivity of said high-permittivity dielectric layer is greater than 8.

6. The semiconductor chip of claim 1 wherein said high-permittivity dielectric material is from 2 to 500 angstroms thick.

7. The semiconductor chip of claim 1 wherein said ultra-thin gate dielectric has an equivalent silicon oxide thickness of less than 10 Angstroms.

8. The semiconductor chip of claim 1 further comprising an interfacial layer underlying said high-permittivity dielectric material.

9. The semiconductor chip of claim 8 wherein said interfacial layer is selected from the group consisting of silicon oxide, silicon oxynitride, metallic silicates, and metallic aluminates.

10. An integrated circuit comprising:
    a substrate;
    a first region formed on the substrate, the first region having formed therein a plurality of first transistors, each of said plurality of first transistors including:
        a first source region;
        a first drain region;
        a first channel region formed between the first source and first drain regions; and
        a first gate electrode electrically separated from the first channel region by a first gate dielectric having a first oxide equivalent thickness, comprising a high permittivity dielectric material; and
    a second region formed on the substrate, the second region having formed therein a plurality of first transistors, each of said plurality of second transistors including:

a second source region;

a second drain region;

a second channel region formed between the second source and second drain regions; and a second gate electrode electrically separated from the second channel region by a second gate dielectric having a second oxide equivalent thickness, comprising an ultra-thin dielectric material, wherein the second oxide equivalent thickness is different than the first oxide equivalent thickness.

11. The integrated circuit of claim 10 wherein the ultra-thin dielectric material has an equivalent silicon oxide thickness of less than 10 angstroms.

12. The integrated circuit of claim 10 wherein the first region is separated from the second region by an isolation structure selected from the group consisting of shallow trench isolation, localized oxidation of silicon (LOCOS), and silicon islands formed on a silicon-on-insulator (SOI) substrate.

13. The integrated circuit of claim 10 wherein the high-permittivity dielectric material is selected from the group consisting of metallic oxides, oxynitrides of metals, metallic silicates, and metallic aluminates.

14. The integrated circuit of claim 10 wherein the high-permittivity dielectric material has a relative permittivity of at least 8.

15. The integrated circuit of claim 10 wherein the first region is a memory array.

16. The integrated circuit of claim 10 further including an interfacial layer between the substrate and the high-permittivity dielectric material.

17. The integrated circuit of claim 10 wherein the ultra-thin dielectric material is selected from the group consisting of silicon oxide, silicon oxynitride, and silicon nitride.

* * * * *